(12) United States Patent
Reitsma

(10) Patent No.: US 10,288,699 B2
(45) Date of Patent: *May 14, 2019

(54) RESONANT IMPEDANCE SENSING WITH A NEGATIVE IMPEDANCE CONTROL LOOP IMPLEMENTED WITH SYNCHRONIZED CLASS D AND OUTPUT COMPARATORS

(71) Applicant: TEXAS INSTRUMENTS INCORPORATED, Dallas, TX (US)

(72) Inventor: George P. Reitsma, Redwood City, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 61 days.

This patent is subject to a terminal disclaimer.

(21) Appl. No.: 15/584,011

(22) Filed: May 1, 2017

(65) Prior Publication Data

US 2017/0234701 A1 Aug. 17, 2017

Related U.S. Application Data

(63) Continuation of application No. 14/585,455, filed on Dec. 30, 2014, now Pat. No. 9,638,763.

(Continued)

(51) Int. Cl.
*G01R 27/28* (2006.01)
*G01R 33/00* (2006.01)
(Continued)

(52) U.S. Cl.
CPC ......... *G01R 33/0023* (2013.01); *G01D 5/202* (2013.01); *G01R 27/2611* (2013.01); *H03K 17/9542* (2013.01)

(58) Field of Classification Search
CPC .......... G01R 33/00; G01R 27/28; G01B 7/14; H03K 3/012; H03K 17/95
See application file for complete search history.

(56) References Cited

U.S. PATENT DOCUMENTS 3,555,534 A 1/1971 Akers et al.
4,310,807 A 1/1982 McKee
(Continued)

FOREIGN PATENT DOCUMENTS

RU 108845 U1 10/2009
SU 1420564 A1 8/1988

OTHER PUBLICATIONS

EU Search Report for Application No. 14876617.3-1022/3090266, dated Jan. 31, 2018.

*Primary Examiner* — Neel D Shah
(74) *Attorney, Agent, or Firm* — Andrew Viger; Charles A. Brill; Frank D. Cimino

(57) ABSTRACT

A resonant impedance sensing system includes a class D negative impedance stage implemented with a Class D comparator, and a loop control stage implemented with an output comparator clocked by the class D comparator, establishing a negative impedance control loop that includes the resonator as a loop filter. The negative impedance stage includes a multi-level current source (such as a current DAC) interfaced to the resonator through an H-bridge controlled by the class D comparator. Class D switching synchronizes resonator oscillation voltage (input to the class D comparator) with resonator current drive (from the multi-level current source), driving the resonator with a negative impedance that balances resonator impedance to maintain sustained oscillation. Negative impedance magnitude is controlled by the loop control stage, with the output comparator generating a multi-level loop control signal the controls drive current level based on resonator oscillation amplitude (the time-average of the multi-level drive current).

23 Claims, 2 Drawing Sheets

Related U.S. Application Data

(60) Provisional application No. 61/922,716, filed on Dec. 31, 2013.

(51) Int. Cl.
  *G01B 7/14* (2006.01)
  *H03K 3/012* (2006.01)
  *H03K 17/95* (2006.01)
  *G01D 5/20* (2006.01)
  *G01R 27/26* (2006.01)

(56) References Cited

U.S. PATENT DOCUMENTS

| | | |
|---|---|---|
| 5,602,711 A | 2/1997 | Curtis et al. |
| 8,432,169 B2 | 4/2013 | Niwa et al. |
| 9,638,763 B2* | 5/2017 | Reitsma ............ G01R 33/0023 |
| 2003/0048186 A1 | 3/2003 | Machul |
| 2003/0071638 A1 | 4/2003 | Machul |
| 2008/0074114 A1 | 3/2008 | Candy |
| 2008/0143448 A1 | 6/2008 | Kuehn |
| 2008/0197839 A1 | 8/2008 | Machul et al. |
| 2009/0133496 A1 | 5/2009 | Kanai et al. |
| 2009/0267596 A1 | 10/2009 | Wang et al. |
| 2013/0314077 A1 | 11/2013 | Okada et al. |
| 2014/0247040 A1* | 9/2014 | Reitsma ................ H03H 2/005 324/207.15 |

\* cited by examiner

RESONANT IMPEDANCE SENSING WITH A NEGATIVE IMPEDANCE CONTROL LOOP IMPLEMENTED WITH SYNCHRONIZED CLASS D AND OUTPUT COMPARATORS

CROSS-REFERENCE TO RELATED APPLICATIONS

This application is a continuation of U.S. patent application Ser. No. 14/585,455, filed 30 Dec. 2014, which claims priority under USC § 119(e) to U.S. Provisional Application 61/922,716, filed 31 Dec. 2013.

BACKGROUND

Technical Field

This Patent Disclosure relates generally to resonant inductive sensors and sensing, such as can be used in sensing position, proximity or physical state or condition.

Related Art

A resonant sensor includes a resonator configured for operation in a resonance state (resonant frequency and amplitude). Sensor electronics drives the resonator with an AC excitation current synchronized with resonator oscillation voltage to maintain resonance (sustained, steady-state oscillation), overcoming a resonator loss factor represented by a resonator impedance (such as series/parallel resistance Rs/Rp). For example, in the case of inductive sensing, the resonator includes an inductive sensing coil that operated at resonance projects a magnetic sensing field.

Resonant sensing is based on changes in resonance state manifested by, for example, changes in resonator oscillation amplitude and frequency resulting from changes in resonator impedance in response to a conductive target. For example, in case of inductive sensing, resonance is affected by a storage or loss in projected magnetic flux energy output from the inductive sensing coil, such as caused by the eddy current effect associated with a conductive target. This sensor response is manifested as a change in resonator impedance (loss factor Rs/Rp).

BRIEF SUMMARY

This Brief Summary is provided as a general introduction to the Disclosure provided by the Detailed Description and Figures, summarizing some aspects and features of the Disclosure. It is not a complete overview of the Disclosure, and should not be interpreted as identifying key elements or features of the invention, or otherwise characterizing or delimiting the scope of the invention disclosed in this Patent Document.

The Disclosure is directed to the problem of sensing using a resonant sensor, such as for sensing position, proximity or physical state or condition. The Disclosure describes apparatus and methods for resonant impedance sensing with a negative impedance control loop including a class D negative impedance stage implemented with a class D comparator, and a loop control stage implemented with an output comparator clocked by the class D comparator.

According to aspects of the Disclosure, a resonant impedance sensing system includes a resonator and an inductance-to-digital conversion (IDC) unit. The resonator is characterized by a resonance state (sustained oscillation) with resonator oscillation amplitude and frequency, and with a resonator impedance (loss factor) that changes in response to a sensed condition. The IDC circuit includes negative impedance circuitry and loop control circuitry.

The negative impedance circuitry is configured to drive multi-level drive current into the resonator with a controlled negative impedance, synchronized with resonator oscillation voltage, based on a multi-level loop control signal. The negative impedance circuitry includes a class D comparator and a multi-level current source interfaced to the resonator through H-bridge circuitry. The class D comparator is configured to receive a resonator oscillation voltage, and to provide a class D switching output D_clk with a frequency synchronized to the resonator oscillation frequency. The multi-level current source is configured to output a multi-level drive current with current levels based on a multi-level loop control signal corresponding to a controlled negative impedance. The H-bridge circuitry is controlled by D_clk to synchronize the multi-level drive current with the resonator oscillation voltage, such that the resonator is driven with a negative impedance, and such that the time average of the multi-level drive current corresponds to the magnitude of the negative impedance and to a resonator oscillation amplitude.

The loop control circuitry incorporates the resonator as a loop filter, and includes amplitude sampling circuitry and an output comparator, both clocked by D_clk. The amplitude sampling circuitry is configured to convert the resonator oscillation amplitude into amplitude samples. The output comparator is configured to output the multi-level loop control signal based on a comparison of the amplitude samples and an amplitude reference, such that the controlled negative impedance substantially cancels resonator impedance, thereby maintaining sustained oscillation.

Other aspects and features of the invention claimed in this Patent Document will be apparent to those skilled in the art from the following Disclosure.

DESCRIPTION

Figure 1:
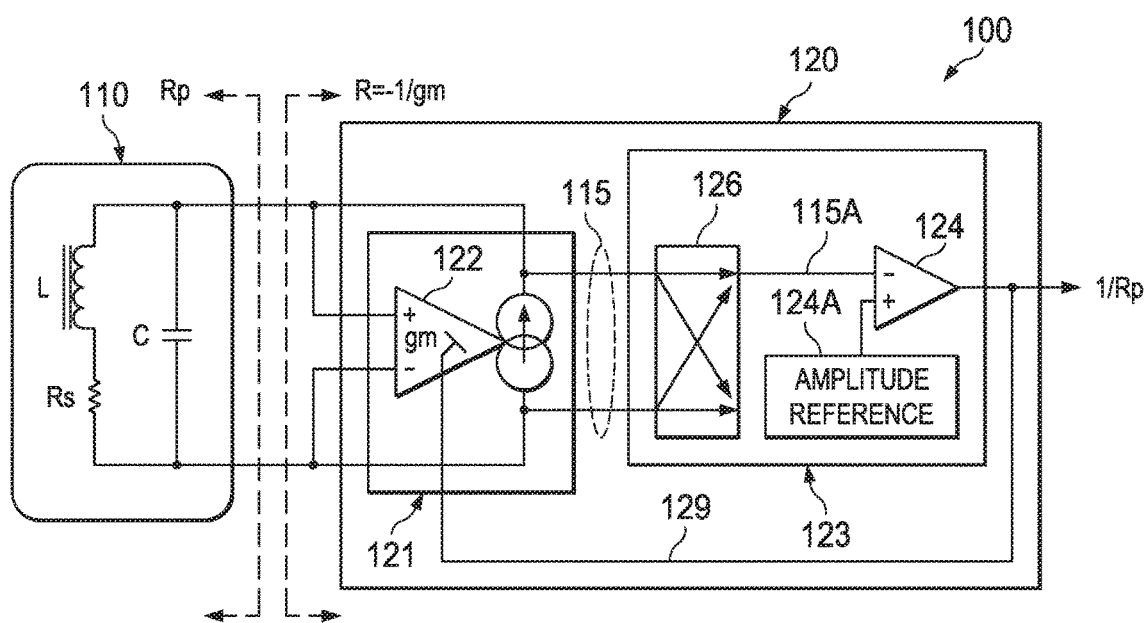
FIG. 1 illustrates an example embodiment of a resonant inductive sensor system that includes an LC resonator, driven by an inductance-to-digital (IDC) converter that includes a Class D negative impedance stage driving excitation current with a negative impedance based on class D switching, and a loop control stage that provides a feedback loop control signal that controls negative impedance magnitude (negative gm).

This Description and the Figures constitute a Disclosure of example embodiments and applications that illustrate various features and advantages of resonant impedance sensing with a negative impedance control loop implemented with synchronized class D and output comparators. The term "class D comparator" means a comparator used in implementing class D functionality, and does not mean, for example, a comparator operating in class D mode driving MOSFET switches.

In brief overview, example embodiments of a resonant impedance sensing system includes a class D negative impedance stage implemented with a Class D comparator, and a loop control stage implemented with an output comparator clocked by the class D comparator, establishing a negative impedance control loop that includes the resonator as a loop filter. The negative impedance stage is configured to drive current into the resonator with a negative impedance, synchronized with resonator oscillation voltage, and includes a multi-level current source (such as a current DAC) interfaced to the resonator through an H-bridge controlled by the class D comparator. Class D switching synchronizes resonator oscillation voltage (input to the class D comparator) with resonator current drive (from the multi-level current source), driving the resonator with a negative impedance that balances resonator impedance to maintain sustained oscillation. Negative impedance magnitude is controlled by the loop control stage, with the output comparator generating a multi-level loop control signal that controls drive current based on resonator oscillation amplitude (the time-average of the multi-level drive current).

In example embodiments, a resonant inductive sensing system includes the IDC unit and a sensor/resonator characterized by a resonator oscillation amplitude and frequency, and at resonance by a resonator impedance (loss factor) that changes in response to a sensed condition. The IDC unit includes negative impedance circuitry and loop control circuitry. The negative impedance circuitry is configured to drive the resonator with multi-level drive current with current levels based on a multi-level loop control signal corresponding to a controlled a negative impedance. The loop control circuitry incorporates the resonator as a loop filter, and is configured to generate the multi-level loop control signal based on a resonator oscillation amplitude, such that the controlled negative impedance substantially cancels resonator impedance, thereby maintaining sustained oscillation.

In example embodiments, the negative impedance circuitry is configured to drive current into the resonator with a negative impedance, synchronized with resonator oscillation voltage. The negative impedance circuitry includes a class D comparator and a multi-level current source interfaced to the resonator through H-bridge circuitry. The class D comparator is configured to receive a resonator oscillation voltage, and to provide a class D switching output D_clk with a frequency synchronized to the resonator oscillation frequency. The multi-level current source is configured to convert the multi-level loop control signal into the multi-level drive current. The H-bridge circuitry is controlled by the class D switching output to synchronize the multi-level drive current with the resonator oscillation voltage, such that the resonator is driven with a negative impedance, and such that the time average of the multi-level drive current corresponds to the magnitude of the negative impedance and the resonator oscillation amplitude. The loop control circuitry includes amplitude sampling circuitry and an output comparator, both clocked by D_clk. The amplitude sampling circuitry is configured to convert the resonator oscillation amplitude into amplitude samples. The output comparator is configured to output the multi-level loop control signal based on a comparison of the amplitude samples and an amplitude reference.

In example embodiments, the output comparator can be a single-bit comparator that outputs a two-level gm_low/high loop control signal, and the multi-level current source is a current DAC that outputs gm_low and gm_high drive current levels (negative impedance magnitude) based on the gm_low/high control signal. The amplitude sampling circuitry can be implemented with amplitude detection circuitry that generates a detected amplitude signal from the resonator oscillation amplitude, and sample/hold circuitry that samples the detected amplitude signal, and provides the resonator oscillation amplitude samples. The loop control circuitry can further include a buffer circuit configured to buffer the resonator oscillation amplitude for input to the amplitude detection circuitry.

In example embodiments, the IDC can include sensor output circuitry configured to output sensor response data corresponding to the multi-level loop control signal as representative of the controlled negative impedance. In addition, the IDC can further include frequency estimation circuitry configured to convert D_clk into a frequency signal corresponding to resonator oscillation frequency, and the sensor output circuitry can be configured to output sensor response data corresponding to the multi-level loop control signal and the frequency signal.

FIG. 1 illustrates an example embodiment of a resonant inductive sensor 100. Sensor 100 includes an LC resonator 110 with a loss factor represented by Rs and an inductance-to-digital (IDC) converter 120. Loss factor Rs equates to an equivalent parallel resistance/impedance Rp.

In an example application, sensor 100 can be used for proximity/position sensing of a conductive target. A proximate conductive target (within the sensing range of sensor 100) will cause a change in resonator impedance (loss factor Rs/Rp), which is detected by IDC 120.

IDC 120 drives resonator 110 with an AC excitation current synchronized with the oscillation frequency of the resonator. IDC 120 includes a negative impedance stage 121 and a loop control stage 123, establishing a negative impedance control loop that includes resonator 110 as a low pass loop filter. The IDC negative impedance control loop drives resonator 110 with a negative impedance to maintain sustained resonator oscillation.

Negative impedance stage 121 drives resonator excitation current, synchronized with resonator oscillation voltage, with a loop-controlled negative impedance. Loop control stage 123 monitors resonator oscillation amplitude (115), and provides to the negative impedance stage 121 a feedback loop control signal 129 that controls negative impedance to maintain sustained resonator oscillation (corresponding to a substantially constant resonator oscillation amplitude). Sustained resonator oscillation corresponds to a negative impedance/resistance that balances resonator impedance/resistance (Rs/Rp loss factor).

Negative impedance stage 121 can be implemented as a trans-admittance amplifier 122 with a controlled trans-admittance (gm). Trans-admittance amplifier 122 drives resonator 110 with excitation/drive current synchronized with resonator oscillation voltage (input to the trans-admittance amplifier), with negative impedance controlled by a feedback gm_admittance loop control signal 129 from loop control stage 123.

Loop control stage 123 can be represented by an amplifier 124 and a rectifier 126. Amplifier 124 provides the gm_admittance loop control signal 129 based on the rectified resonator oscillation amplitude 115A and an amplitude reference 124A. That is, loop control 123 responds to resonator oscillation amplitude 115/115A, generating a gm_amplitude control signal 129 to modulate/tune gm (admittance) of amplifier 122, controlling negative impedance to maintain sustained resonator oscillation.

IDC 120 outputs sensor response data corresponding to the gm_amplitude loop control signal 129 that controls negative impedance (1/Rp, where Rp=L/(C*Rs)). Sensor response data quantifies changes in negative impedance corresponding to changes in resonator impedance (Rs/Rp), such as resulting from a proximate conductive target.

Figure 2:
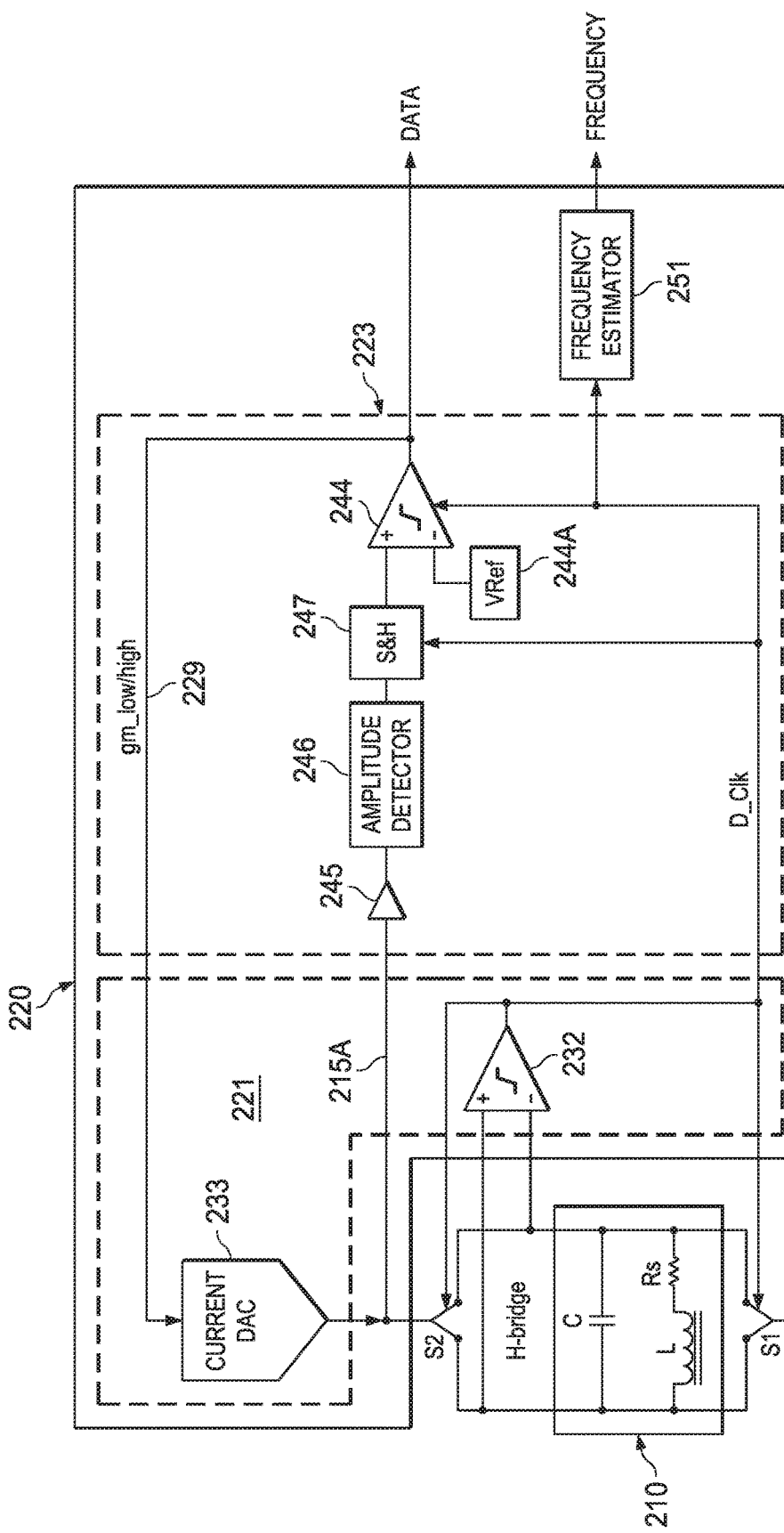
FIG. 2 illustrates an example embodiment of a resonant inductive sensor system including an LC resonator (with loss factor Rs) driven by an inductance-to-digital converter (IDC) including a class D negative impedance stage with a current DAC interfaced to the resonator through a ground-referenced H-bridge controlled by a class D comparator, and including a loop control stage with an output comparator, clocked by the class D comparator, providing a multi-level loop control signal that controls multi-level drive current based on resonator oscillation amplitude (the time average of the multi-level drive current).

FIG. 2 illustrates an example embodiment of a resonant inductive sensor 200. Sensor 200 includes an LC resonator 210 with a loss factor represented by Rs and an inductance-to-digital (IDC) converter 220. Loss factor Rs equates to an equivalent parallel resistance/impedance Rp.

In an example application, sensor 200 can be used for proximity/position sensing of a conductive target. A proximate conductive target (within the sensing range of sensor 100) will cause a change in resonator impedance (loss factor Rs/Rp), which is detected by IDC 220.

IDC 220 drives resonator 210 with an AC excitation current synchronized with the resonator oscillation voltage (i.e., synchronized to the oscillation frequency of the resonator operating at a resonance state). IDC 220 establishes a negative impedance control loop, including resonator 210 as a low pass loop filter, that detects changes in the resonance state of resonator 210 caused by changes in resonator impedance (Rs/Rp), such as resulting from a proximate conductive target.

IDC 220 includes a class D negative impedance stage 221 and a loop control stage 223. Class D negative impedance stage 221 is implemented with a class D comparator 232. Loop control stage 223 is implemented with an output comparator 244 synchronized with (clocked by) the class D switching output from class D comparator 232 (D_clk).

Class D negative impedance stage 221 is implemented as a class D trans-admittance amplifier, including class D comparator 232 and a current DAC 233 interfaced to resonator 210 through a ground-referenced H-bridge S1/S2. Resonator oscillation voltage is input to Class D comparator 232, which outputs a class D switching pulse train that commutates H-bridge S1/S2, synchronizing drive/excitation current from current DAC 233 (input through the H-bridge) with the resonator oscillation voltage (input to the class D comparator).

Class D comparator 232 and the H-bridge provide Class D switching to synchronize drive current with the resonator oscillation voltage (resonator oscillation frequency). Class D comparator 232 commutates the H-bridge to provide positive feedback, connecting the positive side of resonator 210 to current DAC 233, and the negative side of the resonator to ground.

The switching output of class D comparator 232 is also output as a D_clk used to synchronize loop control stage 223 (synchronized with resonator oscillation frequency).

Current DAC 233 drives resonator 210 (through the H-bridge) with multi-level drive/excitation current levels (gm_low and gm_high magnitudes). Current DAC 233 is controlled by a two-level gm_low/high feedback control signal 229 from loop control stage 223, effectively driving resonator 210 with a negative impedance controlled by the multi-level gm_low/high loop control signal 229 from loop control stage 223 (output comparator 244). The multi-level current drive from current DAC 233 is time averaged by the resonator 210, which acts as a low pass loop filter in IDC control loop. That is, the time average of the current levels from current DAC 233 into resonator 210 (synchronized to resonator oscillation frequency by the class D comparator 232) corresponds to resonator oscillation amplitude 215A input to loop control stage 223.

The Class D negative impedance stage 221 can be implemented by a Class D OTA (operational trans-admittance amplifier), with a ground-referenced H-bridge interface. Implementing class D negative impedance stage 221 as a trans-admittance amplifier allows negative impedance to be defined by resistors, which have a low temperature coefficient relative to transistors, thereby mitigating temperature drift. Also, the Class D functionality minimizes power consumption of resonator 210.

Loop control stage 223 receives from class D negative impedance stage 221, resonator oscillation amplitude 215A, and the D_clk output of class D comparator 232. Resonator oscillation amplitude 215A is input to loop control stage 223 through a 1× buffer 245 to avoid loading resonator 210.

The H-bridge S1/S2 effectively rectifies resonator voltage 215A input to loop control stage 223 (i.e., providing rectification as in FIG. 1, 126). D_clk is used to synchronize loop control stage 223 with the class D negative impedance stage (both synchronized to resonator oscillation frequency).

Loop control stage 223 includes an output comparator 244, clocked by D_clk, and generating the multi-level feedback control signal 229 that controls current DAC 233. Output comparator 244 can be a single or multi-bit output comparator, driving a single or multi-bit current DAC. For the example embodiment, output comparator 244 is a single-bit comparator that outputs a two-level gm_low/high loop control 229 signal, which controls a two level current DAC 233 supplying gm_low and gm_high current levels (negative impedance magnitude) to resonator 210 (through the H-bridge).

Output comparator 244 generates the two-level gm_low/high control signal 229 based on resonator oscillation amplitude 215A. An amplitude detector 246 detects resonator oscillation amplitude 215A, which is sampled by sample/hold 247, clocked by D_clk. Resonator oscillation amplitude samples at the D_clock frequency are input to output comparator 244. Amplitude detector 246 and sample/hold 247 (and the 1× buffer 245) can be implemented as an integrate-and-dump filter.

Output comparator 244, synchronized to D_clk, compares the resonator oscillation amplitude samples 215A to an amplitude voltage reference VRef, and generates the two-level gm_low/high loop control signal 229, which is fed back to current DAC 233 in class D negative impedance stage 221. That is, the gm_low/high output levels of output comparator 244 correspond to the gm_low/high admittance levels converted by current DAC 233 into gm_low/high (magnitude) drive current levels input to resonator 210.

The gm_low/high loop control signal 229 corresponds to the magnitude of the negative impedance required to cancel resonator impedance (loss factor Rs/Rp), and sustain resonator oscillation. That is, loop control signal 229 corresponds to the sensing response of resonant sensor 210 (for example, to target proximity/position) in that it represents the negative impedance (1/Rp) required to sustain resonator oscillation, as represented by resonator oscillation amplitude 215A. As such, loop control signal 229 provides sensor negative impedance response Data output from IDC 220.

IDC 220 includes a frequency estimator 251, that receives the D_clk, corresponding to resonator oscillation frequency. Frequency estimator 251 converts D_clk into a Frequency output from IDC 220.

The IDC 220 outputs Data and Frequency provide quantified information about the sensor resonator. For example, for a resonant inductive sensor 200 used with a conductive target (eddy current sensing), the Data and/or Frequency outputs can be used to determine target proximity/position.

The IDC control loop provided by class D negative impedance stage 221 and loop control stage 223, with class D and output comparators 232 and 244, does not require integration or other filtering. Instead, it incorporates resonator 210 as a first-order low pass filter to average the multi-level output of the output comparator. The Class D and output comparators 232/244 are the only active components, reducing power consumption to power dissipated in the sensor resonator.

Resonator 210 is included in the IDC control loop at a summing node, where the positive resonator impedance is compared with the negative impedance of the IDC control loop (class D negative impedance stage 221). Advantages of this configuration include: (a) directly measuring resonator impedance rather than measuring a parameter correlated to it; (b) suppressing nonlinearity from a magnetic core, since, for example, a constant resonator oscillation amplitude of the sensor implies a constant amplitude of the magnetic flux generated by the sensor; (c) optimizing IDC transient response for the sensor, since the transient response of the control loop tracks the transient response of the sensor; and (d) attenuating quantization noise from the IDC by the sensor.

The Disclosure provided by this Description and the Figures sets forth example embodiments and applications, including associated operations and methods, that illustrate various aspects and features of the invention. Known circuits, functions and operations are not described in detail to avoid unnecessarily obscuring the principles and features of the invention. These example embodiments and applications can be used by those skilled in the art as a basis for design modifications, substitutions and alternatives to construct other embodiments, including adaptations for other applications. Accordingly, this Description does not limit the scope of the invention, which is defined by the Claims.

The invention claimed is:

1. An inductance-to-digital conversion (IDC) circuit for use in a system for resonant inductive sensing with a resonator characterized by a resonator oscillation amplitude and frequency, and at resonance by a resonant impedance (loss factor) that changes in response to a sensed condition, the IDC circuit comprising:
   negative impedance circuitry, including:
      a class D comparator to receive a resonator oscillation voltage, and to provide a class D switching output D_clk;
      a discrete current source to output a discrete drive current with discrete current levels based on a discrete loop control signal corresponding to a controlled negative impedance; and
      H-bridge circuitry to interface the discrete current source to the resonator, and controlled by D_clk, such that the time average of the discrete drive current corresponds to a resonator oscillation amplitude; and
   loop control circuitry, incorporating the resonator as a loop filter, and including:
      amplitude sampling circuitry clocked by D_clk, to convert the resonator oscillation amplitude into amplitude samples; and
      an output comparator clocked by D_dlk, to output the discrete loop control signal based on a comparison of the amplitude samples and an amplitude reference.

2. The circuit of claim 1, wherein:
   the output comparator is a single-bit comparator to output a two-level gm_low/high loop control signal, and
   the discrete current source to output gm_low and gm_high drive current levels based on the gm_low/high control signal.

3. The circuit of claim 1, wherein the discrete current source is a current DAC.

4. The circuit of claim 1, wherein the amplitude sampling circuitry includes:
   amplitude detection circuitry to generate a detected amplitude signal corresponding to the resonator oscillation amplitude; and
   sample/hold circuitry to sample the detected amplitude signal, and provides the amplitude samples.

5. The circuit of claim 4, wherein the loop control circuitry further includes a buffer circuit to buffer the resonator oscillation amplitude for input to the amplitude detection circuitry.

6. The circuit of claim 1, further comprising sensor output circuitry to output sensor response data corresponding to the discrete loop control signal as representative of the controlled negative impedance.

7. The circuit of claim 6:
   further comprising frequency estimation circuitry to convert D_clk into a frequency signal corresponding to resonator oscillation frequency; and
   the sensor output circuitry to output sensor response data corresponding to the discrete loop control signal and the frequency signal.

8. The circuit of claim 1, wherein:
   the class D switching output D_clk has a frequency synchronized to the resonator oscillation frequency;
   the H-bridge circuitry is controlled by D_clk to synchronize the discrete drive current with the resonator oscillation voltage; and
   the output comparator outputs the discrete loop control signal to cause the controlled negative impedance to substantially cancel resonant impedance, to maintain a substantially constant resonator oscillation amplitude.

9. An inductance-to-digital conversion (IDC) circuit for use in a system for resonant inductive sensing with a resonator characterized by a resonator oscillation amplitude and frequency, and at resonance by a resonant impedance (loss factor) that changes in response to a sensed condition, the IDC circuit comprising:
   negative impedance circuitry to drive the resonator with discrete drive current with discrete current levels based on a discrete loop control signal corresponding to a controlled a negative impedance; and
   loop control circuitry, incorporating the resonator as a loop filter, to generate the discrete loop control signal based on a resonator oscillation amplitude;
   the negative impedance circuitry including:
      a class D comparator to receive a resonator oscillation voltage, and to provide a class D switching output D_clk;
      a discrete current source to convert the discrete loop control signal into the discrete drive current;
      H-bridge circuitry to interface the discrete current source to the resonator, and controlled by D_clk, such that the time average of the discrete drive current corresponds to the resonator oscillation amplitude; and
   the loop control circuitry including:
      amplitude sampling circuitry clocked by D_clk, to convert the resonator oscillation amplitude into amplitude samples; and
      an output comparator clocked by D_clk, to output the discrete loop control signal based on a comparison of the amplitude samples and an amplitude reference.

10. The circuit of claim 9, wherein:
the output comparator is a single-bit comparator to output a two-level gm_low/high loop control signal, and
the discrete current source to output gm_low and gm_high drive current levels based on the gm_low/high control signal.

11. The circuit of claim 9, wherein the discrete current source is a current DAC.

12. The circuit of claim 9, wherein the amplitude sampling circuitry includes:
amplitude detection circuitry to generate a detected amplitude signal from the resonator oscillation amplitude; and
sample/hold circuitry to sample the detected amplitude signal, and provides the resonator oscillation amplitude samples.

13. The circuit of claim 12, wherein the loop control circuitry further includes a buffer circuit configured to buffer the resonator oscillation amplitude for input to the amplitude detection circuitry.

14. The circuit of claim 9, further comprising sensor output circuitry to output sensor response data corresponding to the discrete loop control signal as representative of the controlled negative impedance.

15. The circuit of claim 14:
further comprising frequency estimation circuitry configured to convert D_clk into a frequency signal corresponding to resonator oscillation frequency; and
the sensor output circuitry to output sensor response data corresponding to the discrete loop control signal and the frequency signal.

16. The circuit of claim 9, wherein:
the class D switching output D_clk has a frequency synchronized to the resonator oscillation frequency;
the H-bridge circuitry is controlled by D_clk to synchronize the discrete drive current with the resonator oscillation voltage; and
the output comparator outputs the discrete loop control signal to cause the controlled negative impedance to substantially cancel resonant impedance, to maintain a substantially constant resonator oscillation amplitude.

17. An inductive sensing system for resonant inductive sensing, comprising:
a resonator characterized by a resonator oscillation amplitude and frequency, and at resonance by a resonant impedance (loss factor) that changes in response to a sensed condition; and
an inductance-to-digital conversion unit coupled to the resonator, including
negative impedance circuitry, including:
a class D comparator to receive a resonator oscillation voltage, and to provide a class D switching output D_clk;
a discrete current source to output a discrete drive current with discrete current levels based on a discrete loop control signal corresponding to a controlled negative impedance; and
H-bridge circuitry to interface the discrete current source to the resonator, and controlled by D_clk, such that the time average of the discrete drive current corresponds to a resonator oscillation amplitude; and
loop control circuitry, incorporating the resonator as a loop filter, and including:
amplitude sampling circuitry clocked by D_Clk, to convert the resonator oscillation amplitude into amplitude samples; and
an output comparator clocked by D_Clk, to output the discrete loop control signal based on a comparison of the amplitude samples and an amplitude reference.

18. The system of claim 17, wherein:
the output comparator is a single-bit comparator to output a two-level gm_low/high loop control signal, and
the discrete current source comprises a current DAC to output gm_low and gm_high drive current levels based on the gm_low/high control signal.

19. The system of claim 17, wherein the amplitude sampling circuitry includes:
amplitude detection circuitry to generate a detected amplitude signal from the resonator oscillation amplitude; and
sample/hold circuitry to sample the detected amplitude signal, and provide the resonator oscillation amplitude samples.

20. The system of claim 19, wherein the loop control circuitry further includes a buffer circuit to buffer the resonator oscillation amplitude for input to the amplitude detection circuitry.

21. The system of claim 17, further comprising sensor output circuitry to output sensor response data corresponding to the discrete loop control signal as representative of the controlled negative impedance.

22. The system of claim 21:
further comprising frequency estimation circuitry to convert D_clk into a frequency signal corresponding to resonator oscillation frequency; and
the sensor output circuitry to output sensor response data corresponding to the discrete loop control signal and the frequency signal.

23. The system of claim 17, wherein:
the class D switching output D_clk has a frequency synchronized to the resonator oscillation frequency;
the H-bridge circuitry is controlled by D_clk to synchronize the discrete drive current with the resonator oscillation voltage; and
the output comparator outputs the discrete loop control signal to cause the controlled negative impedance to substantially cancel resonant impedance, to maintain a substantially constant resonator oscillation amplitude.

* * * * *